(12) United States Patent
Lin

(10) Patent No.: US 6,913,946 B2
(45) Date of Patent: Jul. 5, 2005

(54) METHOD OF MAKING AN ULTIMATE LOW DIELECTRIC DEVICE

(75) Inventor: Charles Lin, Fremont, CA (US)

(73) Assignee: Aptos Corporation, Milpitas, CA (US)

( * ) Notice: Subject to any disclaimer, the term of this patent is extended or adjusted under 35 U.S.C. 154(b) by 0 days.

(21) Appl. No.: 10/461,236

(22) Filed: Jun. 13, 2003

(65) Prior Publication Data

US 2004/0253801 A1 Dec. 16, 2004

(51) Int. Cl.⁷ .......................... H01L 21/44; H01L 21/48; H01L 21/50
(52) U.S. Cl. .................... 438/106; 438/112; 438/124; 438/126; 438/411; 438/421; 438/422; 438/619; 438/624; 438/637; 438/902; 438/958; 438/976
(58) Field of Search ................................ 438/106, 112, 438/124, 126, 411, 421–422, 619, 624, 637, 902, 958, 976

(56) References Cited

U.S. PATENT DOCUMENTS

| | | | | |
|---|---|---|---|---|
| 5,953,626 A | * | 9/1999 | Hause et al. | 438/622 |
| 6,057,224 A | * | 5/2000 | Bothra et al. | 438/619 |
| 6,218,282 B1 | * | 4/2001 | Buynoski | 438/619 |
| 6,245,658 B1 | * | 6/2001 | Buynoski | 438/619 |
| 6,413,852 B1 | * | 7/2002 | Grill et al. | 438/619 |
| 6,495,445 B2 | * | 12/2002 | Clevenger et al. | 4383/619 |
| 6,642,138 B2 | * | 11/2003 | Pan et al. | 438/619 |
| 6,713,835 B1 | * | 3/2004 | Horak et al. | 257/522 |
| 2001/0014526 A1 | * | 8/2001 | Clevenger et al. | 438/619 |
| 2003/0127740 A1 | * | 7/2003 | Hsu et al. | 257/758 |

* cited by examiner

Primary Examiner—Lynne A. Gurley
(74) Attorney, Agent, or Firm—Tung & Associates

(57) ABSTRACT

A method of making a semiconductor device comprising: providing a semiconductor substrate having a plurality of discrete devices formed therein, and a plurality of metal layers and support layers, the support layers comprising an uppermost support layer and other support layers, and wherein each metal layer has an associated support layer having at least a portion underlying the metal layer, and wherein the plurality of metal layers includes an uppermost metal layer including a sealing pad having an opening therethrough, and a passivation layer having at least one opening therein exposing a portion of the sealing pad including the opening therethrough, and the uppermost support layer having a portion exposed through the opening in the sealing pad; exposing the uppermost support layer to an etching material through the opening in the sealing pad and etching away the support layers; and sealing the opening in the sealing pad.

27 Claims, 4 Drawing Sheets

METHOD OF MAKING AN ULTIMATE LOW DIELECTRIC DEVICE

FIELD OF THE INVENTION

This invention relates to semiconductor devices having a low dielectric layer(s) or region(s) and methods of making the same.

BACKGROUND OF THE INVENTION

Low dielectric constant (low-k) materials are important for semiconductors as such materials allow a semiconductor device to run with less capacitance coupling or crosstalk and therefore less delay. A substantial amount of work has gone into the development of low-k materials by those skilled in the art so that such materials are compatible with semiconductor integrated circuit manufacturing processes and equipment and so that the materials still have the lowest dielectric constant value possible. A variety of low-k materials are known to those skilled in the art including spin on and chemical vapor deposition types of organic and inorganic materials. Fluorinated silicon oxide has a dielectric constant value of 3.6. For plasma enhanced chemical vapor deposition deposited low-k, Applied Materials' BLACK DIAMOND and Novellus' CORAL have dielectric constants of about 2.6–2.9. Spin-on low k materials such as Honeywell's HOSP and Dow's SILK, etc., typically have dielectric consant values of 2.5–2.9. AEROGEL has a dielectric constant below 2 but is very fragile due to the high void ratio so it does not have much practical use as of today. Because of their unique mechanical, chemical and etch properties, these new materials have added many new integration/process issues as compared to silicon dioxide based dielectrics.

The lowest possible dielectric constant value, by definition, is "one" which is associated with air or vacuum. Heretofore, integrated circuit manufacturing technology did not provide for a means of building such a device consistently with air or voids as the dielectric. To date, the integrated circuit manufacturing process needs to use physical, solid dielectric and conductive materials to build the final device.

Traditionally, semiconductor devices are made using the "subtraction" method. For example, first a metal layer is deposited. Certain portions of the metal layer are then removed by using a photoresist pattern and plasma etching to define metal lines. The dielectric (for example silicon dioxide) is then filled in between the metal lines using spin on glass or high-density plasma. The oxide surface is planarized using chemical mechanical planarization. This prepares the surface for the next layer.

Recent processes use chemical mechanical planarization and damascene techniques for both oxide and metal layers. Instead of metal etch, a dielectric is patterned with photoresist and etched to form holes and trenches. Metal is deposited (by sputtering or electroplating) into the holes and trenches to form the interconnection. Chemical mechanical planarization polishing is used to remove metal from the top of the dielectric layer. Then the surface is ready for the next dielectric deposition and subsequent repeated process steps.

Regardless of which way the metal is patterned, the device is finally capped with a layer of plasma enhanced chemical vapor deposition silicon nitride which is impermeable to moisture and which is commonly called passivation. Subsequent passivation etch will etch off (away) silicon nitride over the metal bond pads and expose the metal bond pads (typically aluminum or copper). Therefore, the wafer surface is sealed with silicon nitride and only the metal bonding pads are exposed. This guarantees the reliability of the device and that no external element can attack the encapsulated device. The device is then subsequently packaged and typically assembled onto circuit boards.

Air as the dielectric has previously been proposed. The Engel et al., U.S. Pat. No. 6,472,740, discloses covering a device using a mesh shaped disk. The device has air in between the metal lines of the disk. The mesh openings are then filled with an insulating material to form a cap. However, this method is most likely too cumbersome for use in high-volume production.

Fitch et al., U.S. Pat. No. 5,324,683, discloses a method for forming an air region or air bridge overlying a base layer. Air regions are formed overlying the base layer to provide for improved dielectric isolation of adjacent conductive layers, provide air-isolated conductive interconnects, and/or form any other micro-structures or micro-devices. Air regions are formed by either selectively removing a sacrificial spacer or by selectively removing a sacrificial layer. The air regions are sealed, enclosed, or isolated by either a selective growth process or by a non-conformal deposition technique. The air regions may be formed under any pressure, gas concentration or process conditions. The air regions may be formed at any level within the integrated circuit.

Gnade et al., U.S. Pat. No. 5,750,415, discloses a method for forming air gaps between metal leads of a semiconductor device. A metal layer is deposited on the substrate. The metal layer is etched to form metal leads exposing portions of the substrate. A disposable liquid is deposited on the metal leads and the exposed portions of the substrate and a top portion of the disposable liquid is removed to lower the disposable liquid to at least the tops of the metal leads. A porous silica precursor film is deposited on the disposable liquid and over the tops of the leads. The porous silica precursor film is jelled to form a low-porosity silica film. The disposable liquid is removed from the low-porosity silica film to form air gaps between metal leads beneath the low-porosity silica film. The reference suggests that the process reportedly produces air gaps having a low dielectric constant and results in reduce capacitance between the metal leads and decreased power consumption. However, it is believed that this process is very different from current integrated circuit process techniques and would require substantial development and additional processing equipment to accomplish successfully.

Ghoshal, U.S. Pat. No. 6,204,165, discloses a method of fabricating an integrated circuit having air gaps between interconnect levels. An integrated circuit is partially fabricated and includes a top layer, interconnect structures having a cladding layer, dielectric layers and etch stop layer resistant to certain types of etchants. The top layer of the integrated circuit is etched with a second type of etchant. The dielectric layers are then etched with one of the first types of etchant until the etch stop layer is reached. Consequently, portions of the interconnect structures are exposed to create interconnect islands surrounded by a air. A cover is mechanically placed over the exposed interconnect islands to protect the integrated circuit from dust particles and other contaminants.

Dawson et al., U.S. Pat. No. 5,998,293, discloses an interconnect structure including pillars spaced from each other across a wafer. The pillars are placed between levels of interconnect or between an interconnect level and a semiconductor substrate. The pillars are spaced from each other by an air gap, such that each conductor within a level of interconnect is spaced by an air from one another. Air gaps are formed by dissolving a sacrificial dielectric, and the connectors are prevented from bending or warping in regions removed of sacrificial dielectric by anodizing the upper surfaces of each connector and side walls as well. The upper and side wall anodizing provides for a more rigid metal structure. However, this is a complicated process and the pillars utilize a substantial amount of valuable real estate on the semiconductor device.

Bartelink, U.S. Pat. No. 5,567,982, discloses an interconnect structure including conductive transmission line structure and a transmission line support structure. The support structure has a "railroad trestle-like" construction and provides a braced framework to support the transmission line which the author claims greatly reduces the effective dielectric constant. The trestle-like construction of the upper support includes a membrane-like structure and support base structure separated by column-like support members. Spacers between column-like support members form air pockets.

Natzle, U.S. Pat. No. 6,097,092, discloses a dielectric wiring structure and method of manufacturing. Successfully formed wiring layers synergistically combined with subsequent formed side wall support spanning two or more layers to form a self-supporting air dielectric interconnect matrix. Wires are supported by vertical nitride side walls which are, in turn, held in place and supported by the wires. After forming the complete wiring side wall structure, silicon dioxide between and under the wires is removed using gaseous hydrogen fluoride. The metal wires may be clad with nitride for short and oxidation protection. Because side walls are formed after wiring, with wiring at each level providing support, complex support alignment is reportedly not necessary. However, this process also takes up a substantial amount of valuable real estate in a semiconductor device and would have a higher dielectric constant value because of the support dielectric.

Potter et al., U.S. Pat. No. 4,899,439, discloses a high density electrical interconnect having a plurality of metal conductor supported from metal pillars which are electrically isolated from the ground planes by openings. The interconnect can be fabricated using temporary support dielectric, which may be removed after completion to provide an air dielectric or be replaced with a more suitable permanent dielectric. The removal of the temporary support allows the conductors to be coated with protective layers or with a layer of higher conductivity.

Leedy, U.S. Pat. No. 5,985,693, discloses a method for fabricating integrated circuits from flexible membranes formed of very thin low stress dielectric materials such as silicon dioxide and silicon nitride. The semiconductor devices are formed in the semiconductor layer of the membrane. The semiconductor membrane layer is initially formed from a substrate of standard thickness, and all but a thin surface layer of the substrate is then etched or polished away. An air bridge/tunnel structure where amorphous silica is used as a sacrificial layer is then selectively etched off.

Furthermore, some proposed to put down a lid on the device after etching off the dielectric. For high-volume production, this intricate capping technique will prove very difficult and the final reliability of the capped device will be hard to maintain consistently. It is believed that the above processes are not practical or complete.

The present invention provides improvements and/or alternatives to the prior art.

SUMMARY OF THE INVENTION

One embodiment of the invention includes a method of making a semiconductor device comprising: providing a semiconductor substrate having a plurality of discrete devices formed therein, and a plurality of metal layers and support layers, the support layers comprising an uppermost support layer and other support layers, each of the uppermost support layers and the other support layers comprising at least a first type of material, and wherein each metal layer has an associated support layer having at least a portion underlying the metal layer, and wherein the plurality of metal layers includes an uppermost metal layer including a sealing pad having an opening therethrough, and a passivation layer having at least one opening therein exposing a portion of the sealing pad including the opening therethrough, and the uppermost support layer having a portion exposed through the opening in the sealing pad; exposing the uppermost support layer to an etching material through the opening in the sealing pad and etching away the first type of material; and sealing the opening in the sealing pad.

In another embodiment of the invention each of the support layers comprises a solid material.

In another embodiment of the invention the uppermost support layer comprises a first layer of silicon dioxide and a second layer of silicon nitride, and wherein the second layer of silicon nitride underlies the sealing pad, and wherein the first type of material comprises the silicon dioxide.

In another embodiment of the invention the etching material comprises hydrogen fluoride.

In another embodiment of the invention the hydrogen fluoride comprises a gas.

In another embodiment of the invention the hydrogen fluoride comprises an aqueous acid.

In another embodiment of the invention the metal layers comprise at least one of aluminum, aluminum alloys, copper, and copper alloys.

In another embodiment of the invention the sealing of the sealing pad comprises depositing an electrically conductive material on the sealing pad without depositing electrically conductive material into the opening in the sealing pad and after etching the support layers away, reflowing the electrically conductive material to seal the sealing pad.

In another embodiment of the invention wherein the electrically conductive material comprises solder.

In another embodiment of the invention the reflowing of the solder produces a solder ball sealing off the opening in the sealing pad.

Another embodiment of the invention further comprises depositing an under bump metallurgy over the semiconductor device including the sealing pad and into the opening in the sealing pad prior to sealing the sealing pad, and thereafter patterning a photoresist layer over the semiconductor device and wherein the photoresist layer includes an opening therein aligned with the sealing pad and so that a portion of the patterned photoresist covers the opening in the sealing pad, and depositing the electrically conductive material into the opening in the photoresist layer and thereafter removing the photoresist layer so that the electrically conductive material is deposited on the sealing pad and not into the opening in the sealing pad.

Another embodiment of the invention further comprises patterning a photoresist layer over the semiconductor device and wherein the photoresist layer includes an opening therein aligned with the sealing pad and so that a portion of the patterned photoresist covers the opening in the sealing pad, and selectively depositing the electrically conductive material into the opening in the photoresist layer and thereafter removing the photoresist layer so that the electrically conductive material is deposited on the sealing pad and not into the opening in the sealing pad. The surrounding SiN surface is also free from the conductive materials deposited.

In another embodiment of the invention the uppermost support layer comprises a first layer of silicon dioxide and a second layer of silicon nitride overlying the first layer of silicon dioxide, and further comprising a gate oxide and a layer of silicon nitride overlying the gate oxide to protect the gate oxide from being damaged during the etching away of the support layers.

In another embodiment of the invention the support layer comprises at least one of silicon dioxide, doped silicon dioxide, spin-on glass, low dielectric constant spin-on materials, silicon oxynitride, polyimide, photoresist, and a removable organic material.

In another embodiment of the invention the uppermost support layer comprises silicon carbide and other support layers comprise silicon nitride.

In another embodiment of the invention the passivation layer comprises silicon carbide.

In another embodiment of the invention the sealing of the sealing pad comprises bonding the sealing pad to a bond pad on a second substrate.

In another embodiment of the invention the second substrate comprises an integrated circuit and wherein the bond pad on the second substrate optionally may be a dummy bond pad and not connected to an integrated circuit of the second substrate.

In another embodiment of the invention the reflowing of the electrically conductive material is conducted in the presence of nitrogen so that the gaps remaining between metal layers from the etching away of the support layers are filled with the nitrogen.

In another embodiment of the invention the reflowing of the electrically conductive material is conducted in the presence of air so that the gaps remaining between metal layers from the etching away of the support layers are filled with the air.

In another embodiment of the invention the reflowing of the electrically conductive material is conducted in the presence of gas comprising at least one of hydrogen, forming gas, flurocarbon gas and helium so that the gaps remaining between metal layers from the etching away of the support layers are filled with the gas.

In another embodiment of the invention the reflowing of the electrically conductive material is conducted in the presence of argon gas so that the gaps remaining between metal layers from the etching away of the support layers are filled with argon gas.

Another embodiment of the invention further comprises filling the gaps remaining between metal layers with a low dielectric liquid prior to reflowing the electrically conductive material.

In another embodiment of the invention the liquid comprises a fluorocarbon.

In another embodiment of the invention the sealing pad has a disc shaped.

In another embodiment of the invention the sealing pad comprises a hollow cylinder.

In another embodiment of the invention the opening in the sealing pad is cylindrical.

In another embodiment of the invention each one of the other support layers further comprises a second type of material that is not etched away and supports one of the metal layers.

Another embodiment the invention includes a semiconductor device comprising:

a plurality of metal layers including an uppermost metal layer, the uppermost metal layer comprising a sealing pad having an opening therethrough, and a plurality of dielectric layers, wherein at least a portion of one of the dielectric layers is interposed between metal layers, and an electrically conductive sealing ball sealing the opening in the sealing pad to hermetically seal the semiconductor device; and wherein the dielectric layers comprises at least one of air, nitrogen, hydrogen, forming gas, helium, fluorocarbon gas, argon, and a low dielectric constant liquid.

In another embodiment of the invention the dielectric layers consist essentially of air.

In another embodiment of the invention the electrically conductive material comprises solder.

In another embodiment of the invention the sealing pad optionally may be a dummy pad not electrically connected to an integrated circuit of the semiconductor device.

These and other embodiments of the present invention will become apparent from the following brief description of the drawings, detailed description of the preferred embodiments, and appended claims and drawings.

DETAILED DESCRIPTION OF THE PREFERRED EMBODIMENTS

One embodiment of the present invention proposes to keep the same basic traditional integrated circuit process sequence to allow a device to be built without having to employ exotic processes or materials. The main changes involve the top metal and top dielectric layers. As an illustration, in one embodiment the device can be built using silicon dioxide (oxide) as the dielectric, and silicon nitride (nitride) as a passivation. One modification is the dielectric layer below the top metal, which was an oxide in previous processes, now consists of a dual layer of oxide plus nitride. After the final metal layer is processed, a silicon nitride layer is deposited on the wafer to sealed off the device. Therefore, the top metal is enclosed inside silicon nitride. Silicon nitride has a high dielectric constant of about 8. However, the top metal normally has a large size and large separation between metal pads. Concerns for capacitance interference here are much less than that for lower-level metals.

Figure 1:
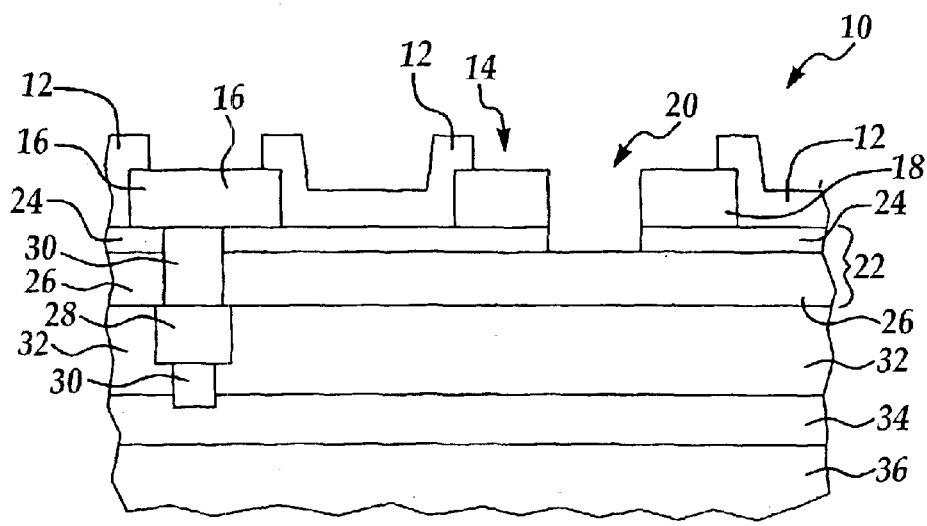
FIG. 1 is a sectional view, with portions broken away, illustrating one embodiment of a semiconductor device including a sealing pad and method of making the same according to the present invention.

FIG. 1 is a sectional view, with portions broken away, illustrating one embodiment of a semiconductor device 10 according to the present invention. The semiconductor device 10 may include an upper passivation layer 12 which may be, for example, silicon nitride. The upper passivation layer 12 is etched to provide openings 14 exposing an upper most or nth level metal layer 16. In this case the nth level metal is the fifth level metal in this device. Of course the semiconductor device can have any number of metal levels as is known by those skilled in the art. The nth level or fifth metal layer includes a sealing pad 18 according to the present invention. The sealing pad 18 includes an opening 20 formed therein. The metal layers as will be described hereafter may be formed in the semiconductor device by any manner known to those skilled in the art including by sputtering or electroplating. At least a portion of a support layer underlies each of the metal layers and preferably the support layer is a sacrificial dielectric layer (inter-level dielectric layer) as will be described hereafter. The nth level support layer or fifth level inter-level dielectric 22 in this particular case is provided under the fifth layer metal 16 and the sealing pad 18. Preferably the nth level support layer or inter-level dielectric 22 includes a silicon nitride layer 24 underlying the fifth metal layer 16 and sealing pad 18 and a silicon dioxide layer 26 underlying the silicon nitride layer 24. As used herein, when a second layer is described as "underlying" or "underlies" (or similar language) a first layer it means that the second layer is directly beneath and in direct contact with the first layer or that one or more additional layers may be interposed between the first and second layers. Likewise, when a second layer is described as "overlying" or "overlies" (or similar language) a first layer it means that the second layer is directly above and in direct contact with the first layer or that one or more additional layers may be interposed between the first and second layers.

Figure 2:
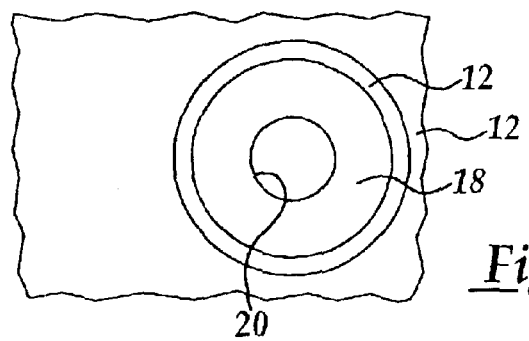
FIG. 2 is a top view, with portions broken away, illustrating one embodiment of the semiconductor device including a sealing pad and method of making the same according to the present invention.

As shown in FIG. 1, the invention includes etched openings 14 in the passivation layer 12 and in the silicon nitride layer 24 of the fifth interlayer dielectric 22. FIG. 2 illustrates a top view of one embodiment of the semiconductor according to the present invention illustrating an opening 20 formed in the sealing pad 18 down to the oxide layer 26 of the fifth inter-level dielectric layer 22. The sealing pad 18 may have any configuration provided an opening extends therethrough to expose the upper most support or inter-level dielectric layer to allow such layer and other support layers to be etched away.

The semiconductor device 10 includes an n-1, n-2 and so on to a first metal layer and an associated support or inter-level dielectric layer for each metal layer and having at least a portion underlying the associated metal layer. As shown in FIG. 1, a n-1 or fourth metal layer 28 is provided underneath the fifth inter-level dielectric layer 22. A via is formed through the fifth interlayer dielectric layer 22 and a plug 30 is provided in the via which preferably is made from the same material as the metal layers (interconnect layers). Plugs 30 are provided interconnecting metal layers to each other in a manner known to those skilled in the art. The fourth metal layer 28 and plug 30 are enclosed in a n-1 or fourth support or inter-level dielectric layer 32. A n-2 or third metal layer is provided underneath the fourth inter-level dielectric 32. A n-3 support or third inter-level dielectric layer 36 is provided having at least a portion underneath and surrounding the third metal layer 34.

Figure 3:
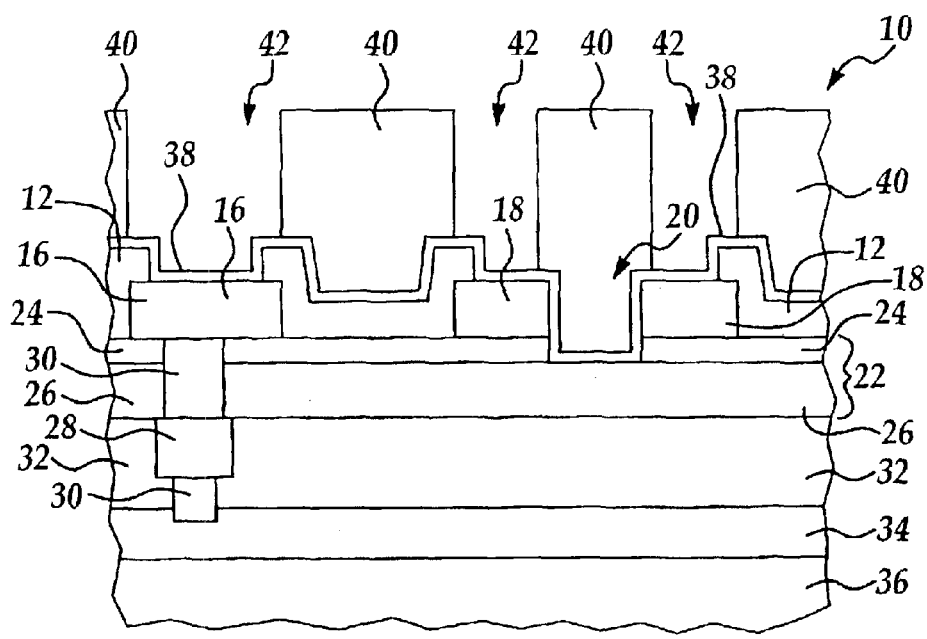
FIG. 3 is a sectional view, with portions broken away, illustrating one embodiment of a semiconductor device including a patterned photoresist layer overlying an under bump metallurgy and sealing pad and method of making the same according to the present invention.

As shown in FIG. 3, an under bump metallurgy 38 may be provided over the entire upper surface of the semiconductor device 10. The under bump metallurgy 38 may be of any construction known to those skilled in the art and may be deposited by any method. Ball limiting metallurgy (BLM) or under bump metallurgy (UBM) generally consists of successive layers of metal. The "adhesion" layer must adhere well to both the bond pad metal and the surrounding passivation, provide a strong, low-stress mechanical and electrical connection. The "diffusion barrier" layer prevents the diffusion of solder into the underlying material. The "solder wettable" layer provides a wettable surface for the molten solder during the solder bumping process, for good bonding of the solder to the underlying metal.

A variety of UBM structures are known to those skilled in the art that accomplish the above functions and have one, two, three or more layers depending on whether the bump is gold, copper, aluminum, solder or nickel based. For gold based bumps, known UBM structure include layers of Cr—Cu, Ti—Pd, Ti—W, or Ti—Pt. For copper based bumps, known UBM structures include layers of Cr—Cu, or Al—Ni. For aluminum based bumps, known UBM structure include layers of Ti or Cr. For solder based bumps, known UBM structures include layers of Cr—Cu—Au, Ni—Cu, Ti—Cu, TiW—Cu, Ni—Au, or Al—NiV—Cu. For nickel based bumps, known UBM structure include layers of nickel. The UBM layers may be deposited by electroplating, evaporation, printing, electroless plating, and/or sputtering. It is also known to deposit one or more seed layers over the UBM structure prior to depositing the electrically conductive material (such as solder) that forms the bump.

Figure 4:
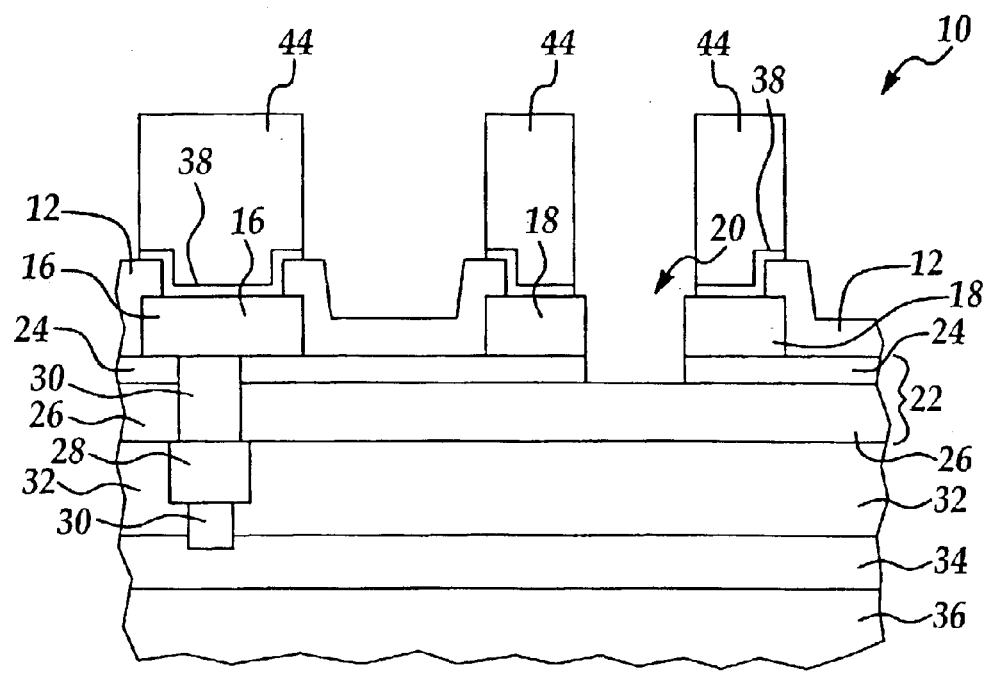
FIG. 4 is a sectional view, with portions broken away, illustrating one embodiment of a semiconductor device wherein an electrically conductive material is selectively deposited in the openings in the patterned photoresist layer similar to FIG. 3 and the removal of the photoresist layer according to the present invention.

A photoresist layer 48 is provided and patterned to provide openings 42 therein and aligned with selective portions of the nth metal layer or fifth main metal layer 16 including the sealing pad 18. A portion of the photoresist layer 40 extends down into the opening 20 in the sealing pad 18. As shown in FIG. 4, an electrically conductive material 44 such as solder is deposited in the openings 42 in the photoresist layer 40 and the photoresist layer 40 is stripped and excess under bump metallurgy 38 not protected by the electrically conductive material 44 is etched away. Other suitable electrically conductive materials 44 include, but are not limited to, copper, silver, gold, nickel, and alloys and mixtures thereof, and conductive composites.

Figure 5:
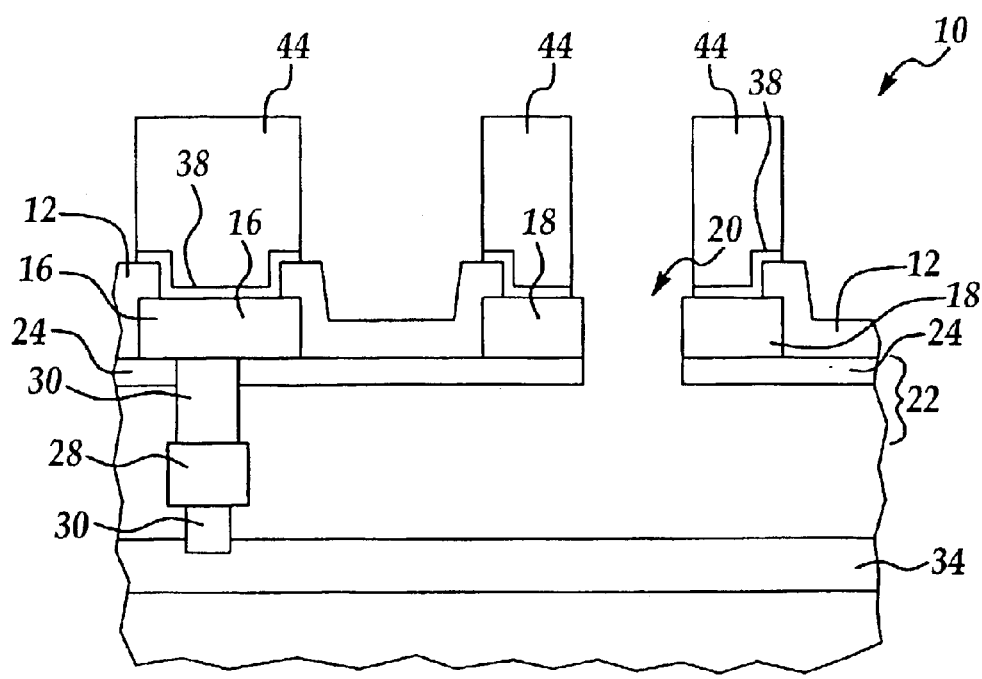
FIG. 5 is a sectional view, with portions broken away, illustrating one embodiment of a semiconductor device similar to FIG. 4 and wherein dielectric layers are etched away through an opening in the sealing pad.
Figure 6:
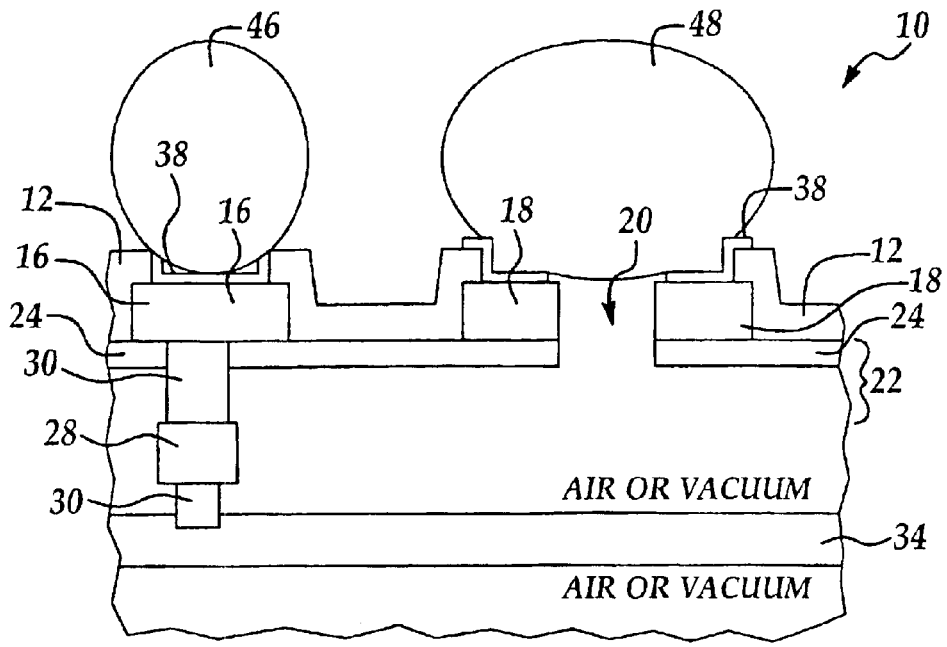
FIG. 6 is a sectional view, with portions broken away, illustrating one embodiment of the semiconductor device similar to FIG. 5 wherein the electrically conductive material is reflown sealing the opening in the sealing pad to provide a hermetically sealed semiconductor device having dielectric layers of air, other gas or liquid according to one embodiment of the invention.

Thereafter, as shown in FIG. 5, the first through nth support or inter-level dielectric layers are etched away to provide air gaps underneath and surrounding the metal layers. Where the support layers are silicon dioxide, hydrogen fluoride in either aqueous acid or gas form may be used to etch away and remove the support layers. It is also possible to use an isotropic plasma for the oxide etch to remove the oxides. After etching off the support dielectric, the cavity needs to be properly cleaned. While many methods are possible, including downstream plasma, solvent, aqueous solution, the preferred method is to use "supercritical $CO_2$ release." The supercritical $CO_2$ has extremely low surface tension which allows it to easily penetrate small space and also creates less problems when the $CO_2$ evaporates. The system uses liquid $CO_2$ to treat the device in the process chamber at pressure. The chamber is then heated pass the $CO_2$ supercritical point and then the pressure is released. As shown in FIG. 6, the electrically conductive material 44 is then reflown to produce electrically conductive balls 46 over the bond pads of the fifth metal level 16, and a sealing structure or ball 48 which closes and hermetically seals the opening 20 in the sealing pad 18. For example, the bond pad 16 and a sealing pad 18 may be coated with a thick layer (approximately 120 microns) of solder by electroplating. It is important to insure that the hole 20 does not get solder deposition therein while the sealing pad 18 surrounding hole 20 does. It is also important to insure that the solder is not easily removable during subsequent processing before reflow. This guarantees that the dielectric layer 26 will be exposed after the bumping process. It is important that the wafer is thoroughly cleaned after the removal of the support layers. By removing all of the support layers or oxide layers the dielectric constant is reduced to the lowest possible value. The reflowing of the electrically conductive material 44 may be conducted in the presence of a variety of gases including air, nitrogen, hydrogen, forming gas (nitrogen and hydrogen), fluorocarbon gas, helium or argon so that the spaces previously occupied by the support layers (that had been etched away) is filled with the gas. Alternatively, the spaces previously occupied by the support layers (that had been etched away) may be filled with a low dielectric constant liquid or other material as desired. In a preferred embodiment, the spaces previously occupied by the support layers (that had been etched away) is filled with nitrogen (which is inert and very similar to air) to provide a dielectric constant of about one.

Figure 7:
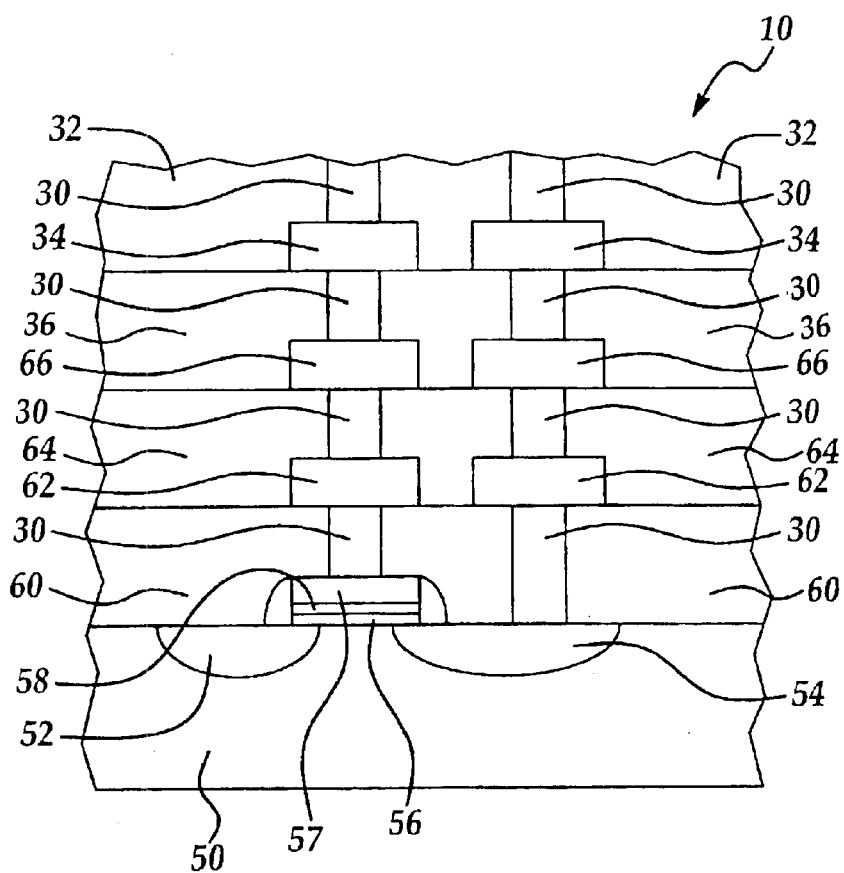
FIG. 7 is a sectional view, with portions broken away, illustrating one embodiment of a semiconductor device according to the present invention.

In order to avoid damage to the gate dielectric, it is useful to put an etch stop layer such as silicon nitride below the first ILD layer so that the dielectric removal is only near and around the metal interconnects and does not damage the gate oxide, underlying polysilicon or single crystal substrate. For example, FIG. 7 illustrates a semiconductor device 10 according to one embodiment of the present invention including a silicon base substrate 50 and having a source 52 and drain 54 formed therein by doping in a manner known to those skilled in the art. A gate oxide 56 is provided over the source 52 and drain 54 and a silicon nitride layer or an etch stop layer 58 is provided over the gate oxide 56. The silicon nitride or etch stop layer 58 is used during the removal (etching) of the support or inter-level dielectric layers from damaging the gate oxide 56. A gate 57 such as polysilicon may be provided over the silicon nitride layer 58. As previously described, plugs 30 are provided in a first level support or first level dielectric layer 60 and which underlies a first metal layer 62. A second support or an second inter-level dielectric layer 64 is provided over the first metal layer 62 and also includes plugs 30 formed therein to interconnect metal layers. A second metal layer 66 is provided over the second inter-level dielectric layer 64. A third support or inter-level dielectric layer 36 is provided as previously described with plugs 30 formed therein and the third metal layer 34 is provided over the third inter-level dielectric layer 36. Of course the support layers 60, 64 and 36 are removed by etching as previously described. In an alternative embodiment, the gate dielectric and trench isolation is not susceptible to etched damage and the etch stop layer may be eliminated. The semiconductor device 10 including the metal layers and support layers may be manufactured by any manner known to those skilled in the art including the "subtraction method" or the damascene method as previously described.

In another embodiment of the invention, to strengthening interconnect structures, a metal 'treatment" can be used. After a trench or via hole is etched in a support or inter-level dielectric layer, a thin layer of chemical vapor deposition tungsten silicide (WSi) is deposited in the via hole, on the trench walls and the flat surfaces. This is followed by the standard deposition of an electrically conductive material such as aluminum, aluminum alloys, copper, copper alloys and mixtures thereof to form the plugs 30 and metal layers. The entire metal on the top surface, including the treatment layer and WSi is removed using chemical mechanical planarization. Alternatively, the WSi can be removed by an anisotropic etchback. As an alternative to WSi, the treatment of the plugs and metal layers can be provided by depositing low stress W, Ti, TiN or TaN and other similar metals and alloys in the vias and flat surfaces before forming the plugs and metal layers.

The support layers or inter-dielectric layers may comprise any dielectric material such as silicon dioxide, a doped oxide, low dielectric constant spin-on polymer, spin-on glass, oxynitride, polyimide, photoresist or removable organics or other materials that can act as a sacrificial layer and be removed by etching to provide a gap between the metal layers. Furthermore, silicon nitride should not be used as the movable material (the support layer or inter-layer dielectric) as it is reserved for passivation. However, if a suitable alternative for passivation is selected, silicon nitride may be used as the sacrificial dielectric, support layer or inter-level dielectric layer. An alternative material for passivation is silicon carbide. It is also possible to use a sandwich of silicon nitride and silicon carbide for passivation. Silicon carbide is well known for its hardness. So having silicon carbide in the passivation should improve the reliability of the device.

Figure 9:
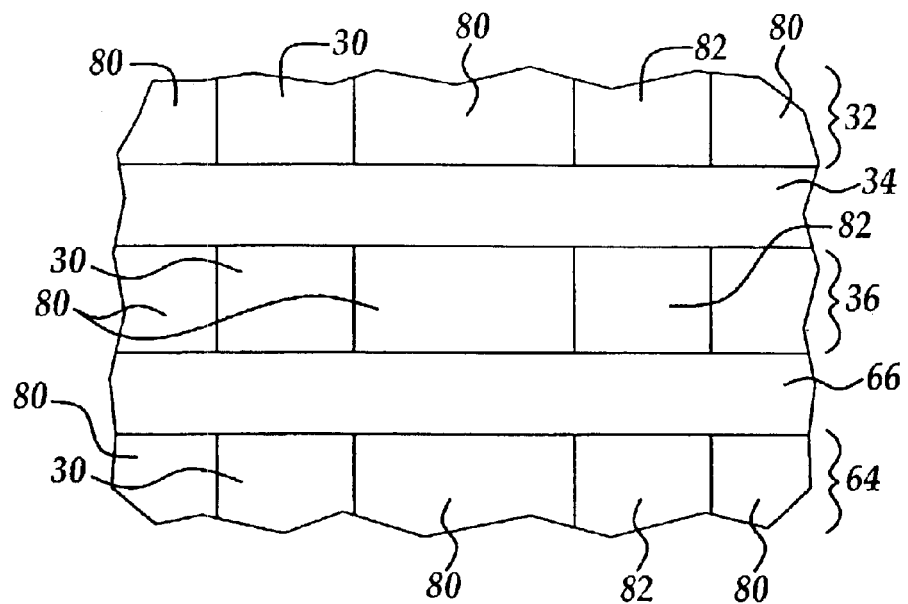
FIG. 9 is a sectional view, with portions broken away, illustrating one embodiment of a semiconductor package according to the present invention.

In an alternative embodiment, after removing the support layer, inorganic vapor can be used to condition the metal surface to reduce its reactivity. Also, since there is no dielectric to hold the metal connectors in place, a "dummy" circuit may be provided to support the electrically conductive structure and prevent the structure from collapsing. In still another embodiment, as an alternative to the total removal of all dielectrics, two types of dielectrics (a first type of material 80 such as silicon dioxide and a second type of material 82 such as silicon nitride as shown in FIG. 9) may be provided and only one removed by the etching process leaving the other dielectric behind to support the metal layers. This will simplify the structure concerns somewhat, but complicates the processing.

The present invention utilizes the sealing pads that function as to seal off the circuit hermetically after removing the dielectrics (for example oxides). The passivation layer 12 should be thick enough (1–6 microns or more) to provide strength on the top side of the device. Openings in the dielectric removal is made during passivation etch of the nitride layer. During flip chip die attach, the sealing pads may be connected to dummy pads on another semiconductor device, circuit board or ceramic board.

Figure 8:
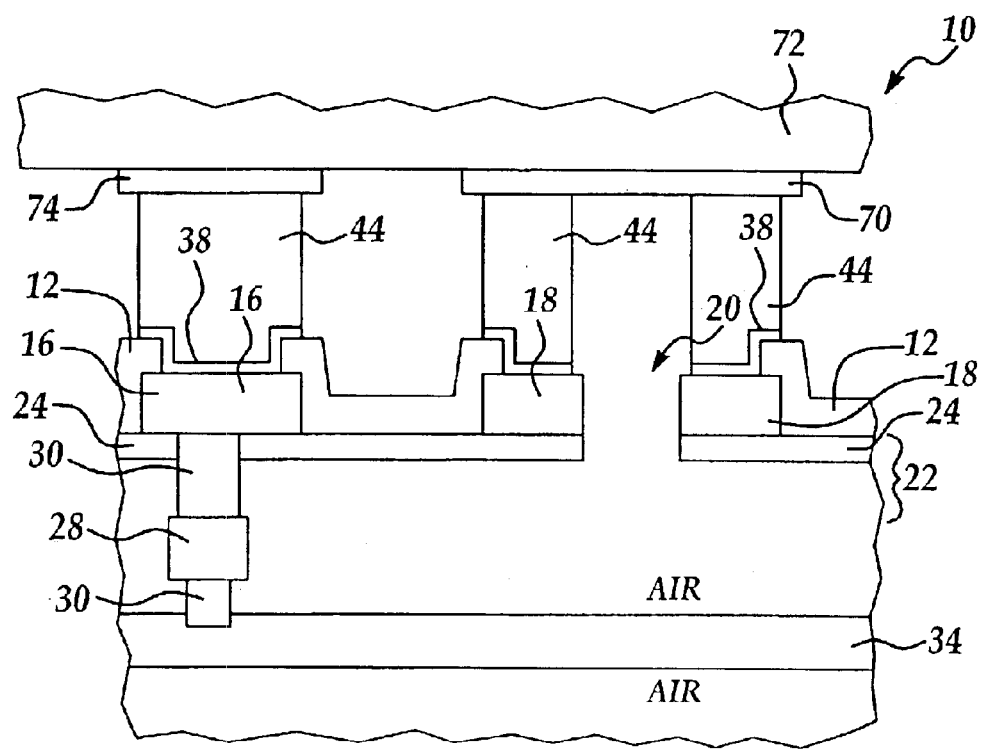
FIG. 8 is a sectional view, with portions broken away, illustrating one embodiment of a semiconductor package according to the present invention.

As an alternative, if for any reason, the opening 20 in the sealing pad 18 for etch off of the dielectric layers is larger than desired, modification to the process sequence may be made. If the opening is very large, surface tension of the electrically conductive material (solder) during reflow may not guarantee a complete hermetic seal of the device. In this case, reflow may be delayed until device packaging time when the opening 20 will be sealed against a dummy metal surface 70 of another substrate 72 such as another semiconductor device, printed circuit board or ceramic board, wherein the top metal layer 16 may be connected to an active bond pad 74 on the other substrate 72 as shown in FIG. 8.

Device heat dissipation should improve by not having any dielectric to insulate around the metal layers and with more pads (enclosure pads) attached to the board for heat transfer. The selection of gas for back filling the cavities (N or forming gas) during reflow will also have some impact on heat transfer and device reliability.

Another benefit of the present invention is the simplification of the process. Copper is a fast diffusing ion and can destroy any device when the ion gets into the silicon based substrate. Barrier metals and barrier layers are painstaking to build to prevent the ions from diffusing around. By having no dielectric between the metal lines there is no media for the ions to diffuse through and therefore eliminates the problem altogether. So theoretically the barrier metals will become unnecessary according to the present invention. Even though one may want to keep the barrier metals for other reasons such as electromigration or reliability purposes.

Another alternative to this method includes (instead of filling the cavity with a gas) filling the gaps (left after removing the dielectric layers) with a non-polar, low-dielectric constant non-electricity-conductive liquid. For example, the liquid may be a fluorocarbon type of compound. The liquid will help reduce the sensitivity of the device to external pressure changes. It will also help dissipate heat coming off the interconnection wires of the device.

What is claimed is:

1. A method of making a semiconductor device comprising:
    providing a semiconductor substrate having a plurality of discrete devices formed therein, and a plurality of metal layers and support layers, the support layers comprising an uppermost support layer and other support layers, each of the upper most support layer and the other support layers comprising at least a first type of material, and wherein each metal layer has an associated support layer having at least a portion underlying the metal layer, and wherein the plurality of metal layers includes an uppermost metal layer including a sealing pad having an opening therethrough, and a passivation layer having at least one opening therein exposing a portion of the sealing pad including the opening therethrough, and the uppermost support layer having a portion exposed through the opening in the sealing pad;
    exposing the uppermost support layer to an etching material through the opening in the sealing pad and etching away the first type of material;
    sealing the opening in the sealing pad; and
    wherein the sealing of the sealing pad comprises depositing an electrically conductive material on the sealing pad without depositing electrically conductive material into the opening in the sealing pad and after etching the support layers away, reflowing the electrically conductive material to seal the sealing pad.

2. A method as set forth in claim 1 wherein each of the support layers comprises a solid material.

3. A method as set forth in claim 2 wherein the uppermost support layer comprises a first layer of silicon dioxide and a second layer of silicon nitride, and wherein the second layer of silicon nitride underlies the sealing pad and wherein the first type of material comprises silicon dioxide.

4. A method as set forth in claim 1 wherein the etching material comprises hydrogen fluoride.

5. A method as set forth in claim 4 wherein the hydrogen fluoride comprises a gas.

6. A method as set forth in claim 1 wherein the etch material comprises at least one of an aqueous acid and a plasma comprising fluorine.

7. A method as set forth in claim 1 wherein the metal layers comprise at least one of aluminum, aluminum alloys, copper, and copper alloys.

8. A method as set forth in claim 1 wherein the electrically conductive material comprises solder.

9. A method as set forth in claim 8 wherein the reflowing of the solder produces a solder ball sealing off the opening in the sealing pad.

10. A method as set forth in claim 1 further comprising depositing an under bump metallurgy over the semiconductor device including the sealing pad and into the opening in the sealing pad prior to sealing the sealing pad, and thereafter patterning a photoresist layer over the semiconductor device and wherein the photoresist layer includes an opening therein aligned with the sealing pad and so that a portion of the patterned photoresist covers the opening in the sealing pad, and depositing the electrically conductive material into the opening in the photoresist layer and thereafter removing the photoresist layer so that the electrically conductive material is deposited on the sealing pad and not into the opening in the sealing pad.

11. A method as set forth in claim 1 further comprising patterning a photoresist layer over the semiconductor device and wherein the photoresist layer includes an opening therein aligned with the sealing pad and so that a portion of the patterned photoresist covers the opening in the sealing pad, and selectively depositing the electrically conductive material into the opening in the photoresist layer and thereafter removing the photoresist layer so that the electrically conductive material is deposited on the sealing pad and not into the opening in the sealing pad.

12. A method as set forth in claim 1 wherein the uppermost support layer comprises a first layer of silicon dioxide and a second layer of silicon nitride overlying the first layer of silicon dioxide, and further comprising a gate oxide and a layer of silicon nitride overlying the gate oxide to protect the gate oxide from being damaged during the etching away of the first type of material.

13. A method as set forth in claim 1 wherein the support layer comprises at least one of silicon dioxide, doped silicon dioxide, spin-on glass, low dielectric constant spin-on material, silicon oxynitride, polyimide, photoresist and a removable organic material.

14. A method as set forth in claim 1 wherein the uppermost support layer comprises silicon carbide and the other support layers comprise silicon nitride and wherein the first type of material comprises the silicon nitride.

15. A method as set forth in claim 1 wherein the passivation layer comprises silicon carbide.

16. A method as set forth in claim 1 wherein the reflowing of the electrically conductive material is conducted in the presence of nitrogen so that gaps remaining between metal layers from the etching away of the support layers are filled with the nitrogen.

17. A method as set forth in claim 1 wherein the reflowing of the electrically conductive material is conducted in the presence of air so that gaps remaining between metal layers from the etching away of the support layers are filled with the air.

18. A method as set forth in claim 1 wherein the reflowing of the electrically conductive material is conducted in the presence of argon gas so that gaps remaining between metal layers from the etching away of the support layers are filled with argon gas.

19. A method as set forth in claim 1 further comprising filling gaps remaining between metal layers with a low dielectric liquid prior to reflowing the electrically conductive material.

20. A method as set forth in claim 19 wherein the liquid comprises a fluorocarbon.

21. A method as set forth in claim 1 wherein the sealing pad has a disc shaped with the opening therethrough.

22. A method as set forth in claim 1 wherein the sealing pad comprises a hollow cylinder.

23. A method as set forth in claim 1 wherein the opening in the sealing pad is cylindrical.

24. A method as set forth in claim 1 wherein each one of the other support layers further comprises a second type of material that is not etched away and supports one of the metal layers after the etching.

25. A method as set forth in claim 1 wherein the reflowing of the electrically conductive material is conducted in the presence of gas comprising at least one of air, nitrogen, hydrogen, forming gas, fluorocarbon gas, and helium so that gaps remaining between metal layers from the etching away of the support layers are filled with the gas.

26. A method as set forth in claim 1 wherein the sealing of the sealing pad comprises bonding the sealing pad to a bond pad on a second substrate.

27. A method as set forth in claim 26 wherein the second substrate comprises an integrated circuit and wherein the bond pad on the second substrate is a dummy bond pad and not connected to an integrated circuit of the second substrate.

* * * * *